US012707738B2

(12) United States Patent
Liu et al.

(10) Patent No.: US 12,707,738 B2
(45) Date of Patent: Aug. 11, 2026

(54) CMOS IMAGE SENSORS AND MANUFACTURING METHODS THEREOF

(71) Applicant: Taiwan Semiconductor Manufacturing Company, Ltd., Hsinchu (TW)

(72) Inventors: Chao-Te Liu, Kaohsiung City (TW); Szu-Ying Chen, Miaoli County (TW); Chih-Ming Hung, Dacun Township (TW); Rui-Fu Hung, Taichung City (TW); Dun-Nian Yaung, Taipei City (TW); Chen-Jong Wang, Hsin-Chu (TW); Kuan-Chieh Huang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1040 days.

(21) Appl. No.: 17/749,333

(22) Filed: May 20, 2022

(65) Prior Publication Data

US 2023/0141681 A1 May 11, 2023

Related U.S. Application Data

(60) Provisional application No. 63/278,253, filed on Nov. 11, 2021.

(51) Int. Cl.
*H10F 39/00* (2025.01)
*H04N 25/77* (2023.01)
*H10F 39/18* (2025.01)

(52) U.S. Cl.
CPC ..... *H10F 39/80373* (2025.01); *H10F 39/014* (2025.01); *H04N 25/77* (2023.01);
(Continued)

(58) Field of Classification Search
CPC ............. H10F 39/80373; H10F 39/014; H10F 39/182; H04N 25/77
See application file for complete search history.

(56) References Cited

U.S. PATENT DOCUMENTS

2002/0028569 A1 3/2002 Igarashi et al.
2004/0155269 A1 8/2004 Yelehanka et al.
(Continued)

FOREIGN PATENT DOCUMENTS

JP H04211120 A 8/1992
JP 2011014808 A 1/2011

*Primary Examiner* — Trang Q Tran
(74) *Attorney, Agent, or Firm* — Eschweiler & Potashnik, LLC

(57) ABSTRACT

Various embodiments of the present disclosure are directed towards an integrated circuit on a semiconductor substrate. First and second gate electrode structures are disposed over the substrate and are spaced laterally from one another. A common source/drain region is disposed in the semiconductor substrate between the first and second gate electrode structures. An insulator layer overlies the first and second gate electrode structures. A source/drain contact extends through the insulator layer between the first and second gate electrode structures to contact the common source/drain region. First and second sidewall spacer structures are disposed along outer sidewalls of the first and second gate electrode structures, respectively, and have first and second outer sidewalls, respectively, adjacent to the source/drain contact. The first outer sidewall includes at least two indentations facing a first side of the source/drain contact, and the second outer sidewall includes at least two indentations facing a second side of the source/drain contact.

20 Claims, 10 Drawing Sheets

(52) U.S. Cl.
CPC ........ *H10F 39/182* (2025.01); *H10F 39/8053* (2025.01); *H10F 39/809* (2025.01)

(56) References Cited

U.S. PATENT DOCUMENTS

| | | | | |
|---|---|---|---|---|
| 2009/0294866 | A1* | 12/2009 | Eller .................... | H10D 64/017 438/231 |
| 2013/0149854 | A1 | 6/2013 | Ishii et al. | |
| 2014/0027820 | A1* | 1/2014 | Aquilino ........... | H01L 21/76232 438/294 |
| 2016/0056202 | A1 | 2/2016 | Hsu et al. | |
| 2020/0135590 | A1 | 4/2020 | Lai et al. | |

* cited by examiner

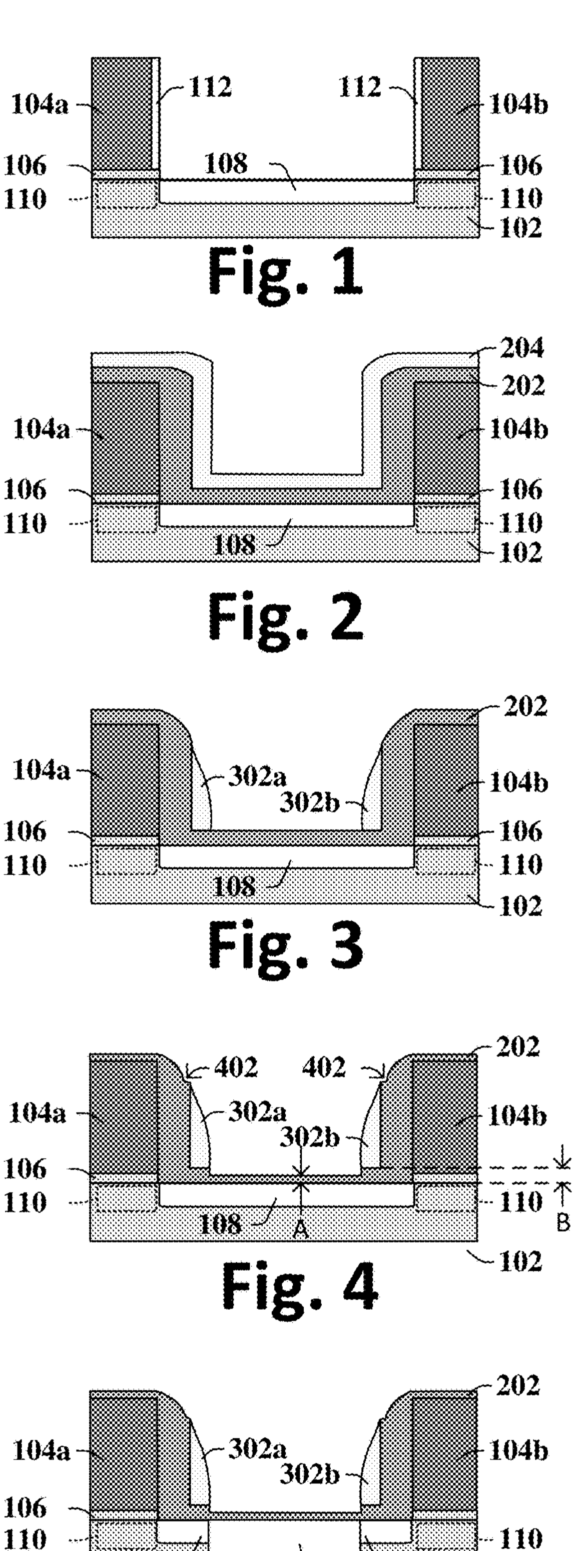
104a
112
112
104b
106
108
106
110
110
102
Fig. 1
204
202
104a
104b
106
106
110
110
108
102
Fig. 2
202
104a
302a
302b
104b
106
106
110
110
108
102
Fig. 3
402
402
202
104a
302a
104b
302b
106
110
110
108
A
B
102
Fig. 4
202
104a
302a
302b
104b
106
110
110
108
108
102
502
Fig. 5
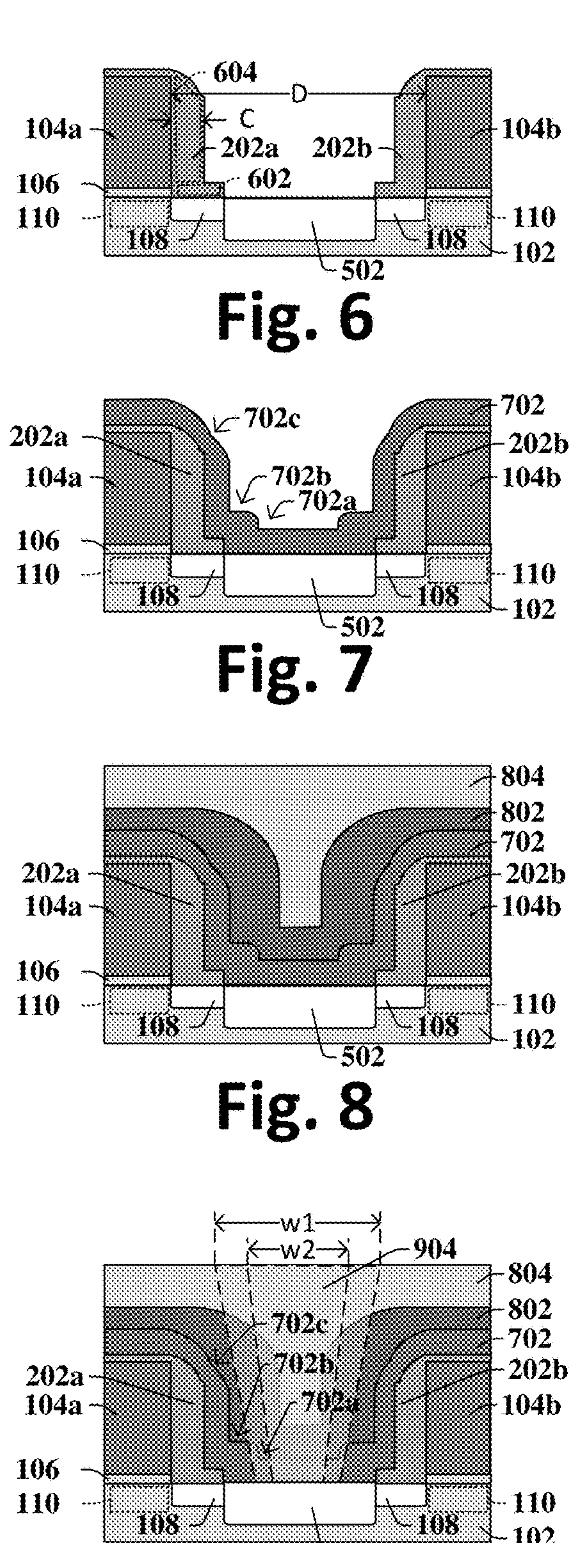
604
D
104a
C
104b
202a
202b
602
106
110
110
108
108
102
502
Fig. 6
702c
702
202a
202b
702b
104a
702a
104b
106
110
110
108
108
102
502
Fig. 7
804
802
702
202a
202b
104a
104b
106
110
110
108
108
102
502
Fig. 8
w1
w2
904
804
802
702c
702
702b
202a
202b
104a
702a
104b
106
110
110
108
108
102
502
Fig. 9

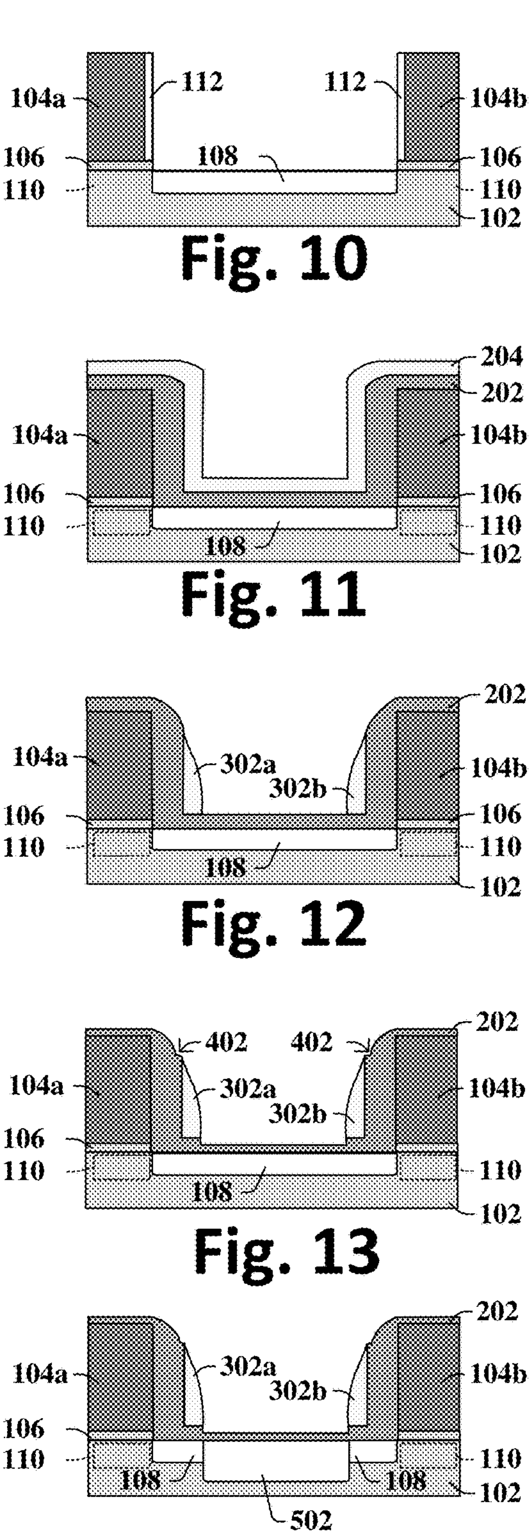
Fig. 10
Fig. 11
Fig. 12
Fig. 13
Fig. 14
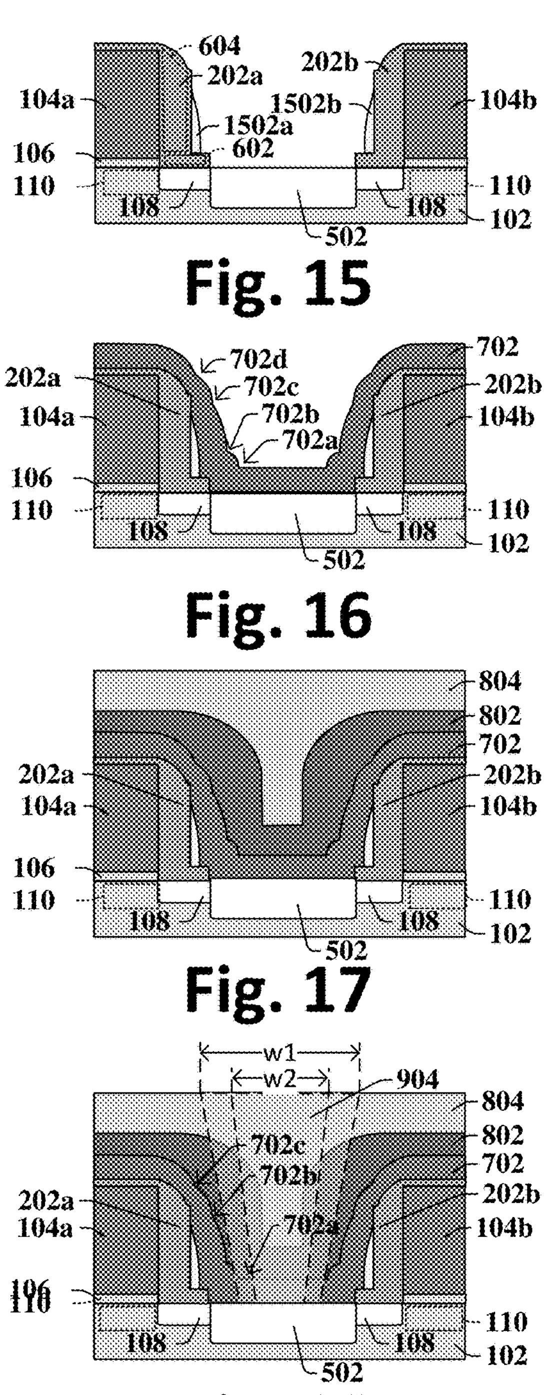
Fig. 15
Fig. 16
Fig. 17
Fig. 18

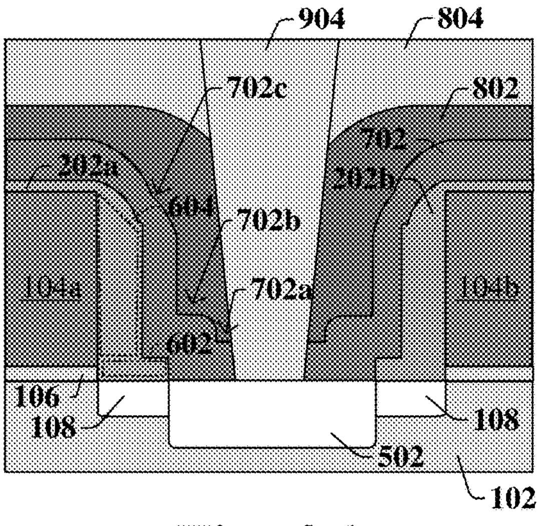
Fig. 26
Fig. 27
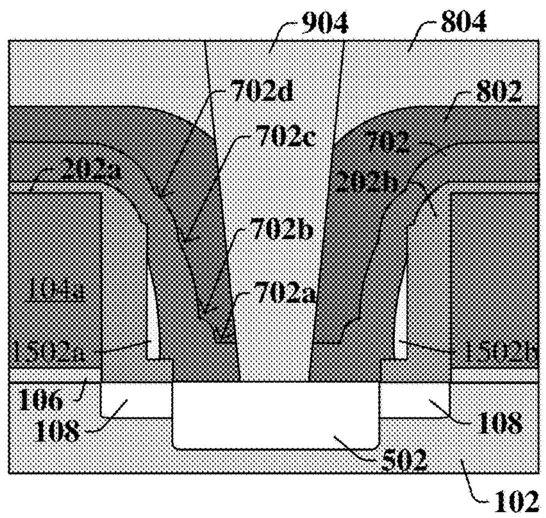
Fig. 28
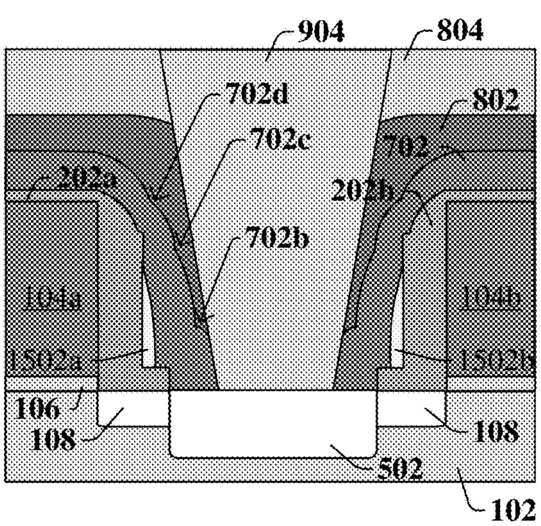
Fig. 29

CMOS IMAGE SENSORS AND MANUFACTURING METHODS THEREOF

REFERENCE TO RELATED APPLICATION

This Application claims the benefit of U.S. Provisional Application No. 63/278,253, filed on Nov. 11, 2021, the contents of which are hereby incorporated by reference in their entirety.

BACKGROUND

Integrated circuits (ICs) with image sensors are used in a wide range of modern day electronic devices, such as cameras and cell phones, for example. Complementary metal-oxide semiconductor (CMOS) devices have become popular IC image sensors. Compared to charge-coupled devices (CCDs), CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

FSI image sensors are an established technology that is favorable in lower-cost applications with larger pixels. In FSI image sensors, light falls on a front-side of an IC, and passes through a stack of back-end-of-line (BEOL) metal interconnect layers, before being collected at photodetectors. Often, the BEOL metal layers have openings over the individual photodetectors to improve transmission of light to the photodetectors. In contrast, in BSI sensors, light falls on a back-side of an IC, and a BEOL metal interconnect structure is disposed on a front-side of the IC, such that the light does not pass through any part of the BEOL metal interconnect before being collected at the photodetectors. Both FSI and BSI image sensors are used in commercial implementations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-9 illustrate a series of cross-sectional views of some embodiments of a method for forming a CMOS image sensor.

FIGS. 10-18 illustrate a series of cross-sectional views of some other embodiments of a method for forming a CMOS image sensor.

FIGS. 26-30 illustrate cross-sectional views of various integrated circuits having a source/drain contact that extends downwardly between sidewall spacer structures of neighboring gate electrode structures in accordance with some embodiments.

DETAILED DESCRIPTION

Figure 19:
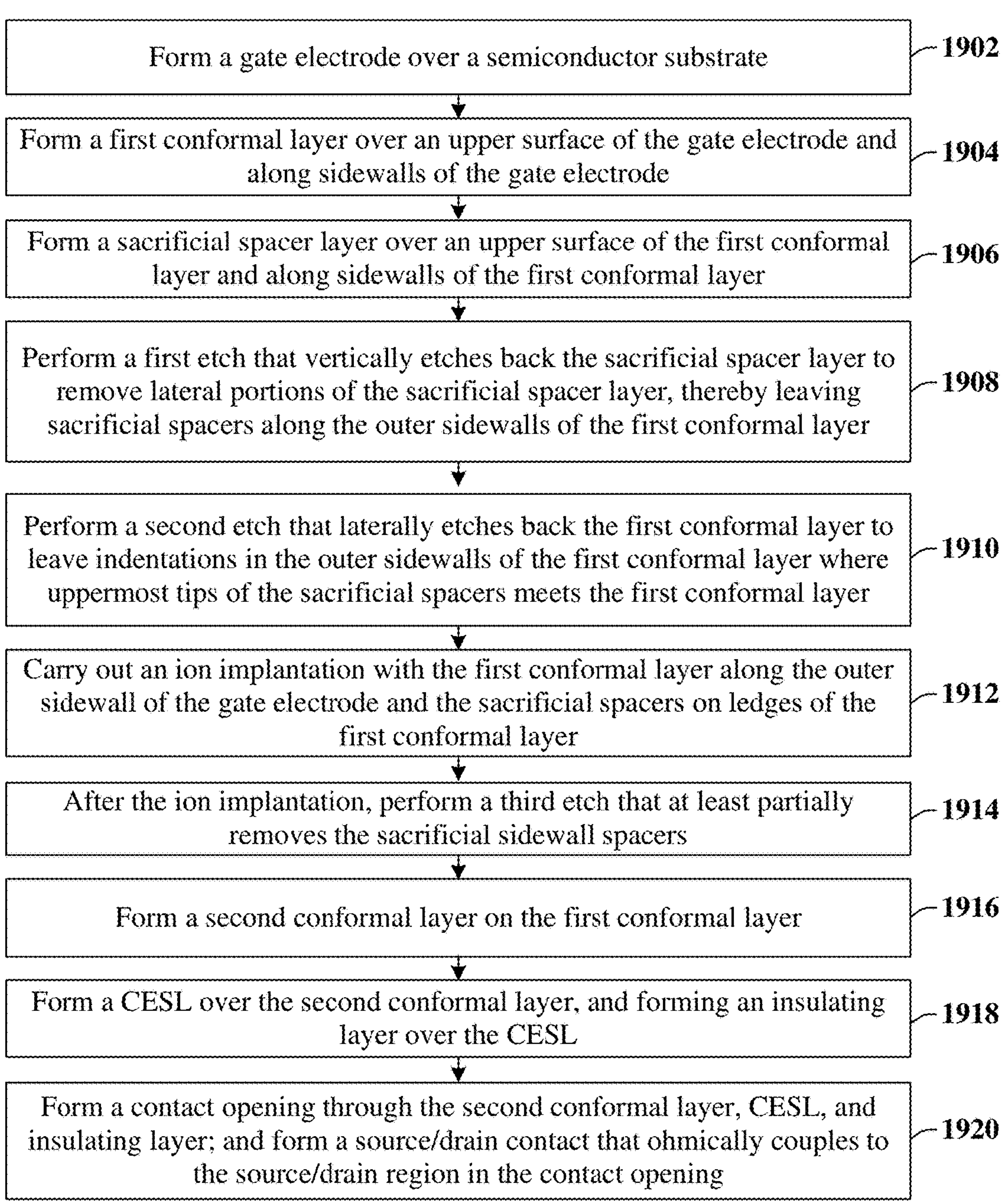
FIG. 19 illustrates a flow chart of some embodiments of a method for forming a CMOS image sensor.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

BSI and FSI image sensors include an array of photodetectors disposed in a semiconductor substrate. Transistors are disposed on the semiconductor substrate and provide operative coupling between the various photodetectors. Some neighboring transistors include a common source/drain region that is shared for the neighboring transistors and is arranged between neighboring gate electrode structures of the neighboring transistors, respectively. As been appreciated in some aspects of the present disclosure, it is desirable to scale the photodetectors and the transistors so they are smaller in future technology generations, however, the spacing between nearest sidewalls of the gate electrode structures acts as a "pinch point" in some regards for this scaling. Accordingly, in some aspects of the present disclosure, during manufacturing of image sensors, sidewall spacer structures are initially formed along nearest sidewalls of neighboring gate electrode structures. Then, with the sidewall spacer structures in place, a source/drain region is formed in the substrate between nearest sidewalls of the sidewall spacer structures using an ion implantation process. Then, after the source/drain region is formed, the sidewall spacer structures are etched back in a lateral direction to "widen" the lateral spacing between nearest sidewalls of the sidewall spacer structures. Additional sidewall spacer layers and/or a contact etch stop layer is formed, and a source/drain contact is formed to contact the source/drain region. Because the sidewall spacer structures have been etched back during manufacturing to "widen" the lateral spacing between nearest sidewalls of the neighboring gate electrode structures, the "pinch point" is removed, and the gate electrode structures can now be spaced more closely together by an amount approximately equal to the amount the sidewall spacer structures are pulled back. Therefore, the present techniques provide FSI and BSI image devices that have higher pixel densities than previously achievable.

FIGS. 1-9 show an example of a manufacturing flow for image sensor devices corresponding to some embodiments of the present disclosure.

In FIG. 1, a semiconductor substrate 102 is provided, and a gate dielectric layer, such as a high-k dielectric is formed over the semiconductor substrate 102. A gate electrode layer is then formed over the gate dielectric layer. The gate electrode and gate dielectric are patterned, for example by forming a mask (e.g., a photoresist mask) over the gate electrode layer, and performing an etch with the mask in place, thereby forming first and second gate electrode structures 104*a*, 104*b*, which are separated from the semiconductor substrate 102 by a gate dielectric structure 106. A lightly doped drain (LDD) region 108 is then formed in the semiconductor substrate 102, for example by ion implantation. When formed, the LDD region 108 has a first doping type, leaving a channel region 110 under the first and second gate electrode structures 104*a*, 104*b* with a second doping type. For example, the first doping type can be n-type and the second doping type can be p-type, or vice versa. A seal oxide layer 112 can also be present along sidewalls of the first and second gate electrode structures 104*a*, 104*b* in some embodiments. This seal oxide layer 112 is omitted in subsequent figures, but it is to be appreciated that the seal oxide layer could also remain in place and be carried through the subsequent figures in other embodiments.

In FIG. 2, a first conformal layer 202 is formed over an upper surface of the first and second gate electrode structures and along sidewalls of the first and second gate electrode structures. A sacrificial conformal layer 204 is formed over an upper surface of the first conformal layer 202 and along sidewalls of the first conformal layer 202. In some embodiments, the first conformal layer 202 comprises an oxide, such as silicon dioxide, and the sacrificial conformal layer 204 comprises a nitride, such as silicon nitride.

In FIG. 3, a first etch back process is performed to remove lateral portions of the sacrificial conformal layer 204 of FIG. 2, thereby leaving sacrificial sidewall spacer structures 302*a*, 302*b*, on upper surfaces of a base portion of the first conformal layer 202. The sacrificial sidewall spacer structures 302*a*, 302*b* are also disposed along the outer sidewalls of the first conformal layer 202. In some embodiments, the first etch back process has a first selectivity to the first conformal layer 202 and a second selectivity to the sacrificial conformal layer 204 of FIG. 2; and the second selectivity can be greater than the first selectivity by an amount of about 50:1. The first etch back process can include a dry etch.

In FIG. 4, a second etching process, which can include a wet etch, is performed. This second etching process thins a base portion of the first conformal layer 202, thereby reducing the implantation energy needed for subsequent source/drain formation. The second etching process also laterally etches back an exposed upper portion of the first conformal layer 202 to leave indentations 402 in the outer sidewalls of the first conformal layer 202 where uppermost tips of the sacrificial sidewall spacer structures 302*a*, 302*b* meet the first conformal layer 202. In some embodiments, the second etching process has a third selectivity to the first conformal layer 202 and a fourth selectivity to the sacrificial sidewall spacer structures 302*a*, 302*b*; and the third selectivity can be greater than the fourth selectivity by an amount of about 100:1. In some embodiments, a remaining thinned portion of the first conformal layer 202 has a first height A, and an original, un-thinned portion of the first conformal layer 202 has a second height B under the sacrificial sidewall spacer structures 302*a*, 302*b*, with a ratio A:B ranging from 1:20 to 4:5 in some embodiments.

In FIG. 5, an ion implantation is carried out with the first conformal layer 202 along the outer sidewalls of the gate electrode structures and the sacrificial sidewall spacer structures 302*a*, 302*b* in place on the base portion of the first conformal layer 202. This ion implantation, which can be followed by an anneal in some cases, forms a common source/drain region 502 having the first doping type that is the same as the LDD regions 108, albeit the common source/drain region 502 often has a higher dopant concentration than the LDD regions 108.

In FIG. 6, after the ion implantation, a third etching process is carried out to at least partially remove the sacrificial sidewall spacer structures 302*a*, 302*b* in FIG. 5. In FIG. 6's example, the sacrificial sidewall spacer structures 302*a*, 302*b* and a bottom lateral portion of the first conformal layer are completely removed, thereby leaving a first inner layer structure 202*a* along the outer sidewall of a first gate electrode structure 104*a* and a second inner layer structure 202*b* along the outer sidewall of the second gate electrode structure 104*b*. This can be achieved by wet etching and/or dry etching, and the etch used can have a different selectivity to first conformal layer 202 and the sacrificial sidewall spacer structures 302*a*, 302*b*. For example, the etch can have a selectivity of greater than or equal to 100:1 between first conformal layer 202 and the sacrificial sidewall spacer structures 302*a*, 302*b* in some cases. Thus, after the third etching process, the first inner layer structure 202*a* can include a base portion 602 and a collar portion 604 extending upward from the base portion. Further, in some embodiments, the collar portion has a sidewall thickness C, and there is a lateral spacing D between nearest outer sidewalls of the first and second gate electrode structures 104*a*, 104*b*, such that the structure exhibits a ratio C:D ranging from 1:20 to 3:20 in some embodiments. This ratio C:D is a range in which the nearest sidewalls of the first and second gate electrode structures 104*a*, 104*b* could otherwise act as a "pinch point" when a source/drain contact is formed. Therefore, in this range, reducing the width of the sacrificial sidewall spacer structures 302*a*, 302*b* will help reduce this pinch point and provide an integrated circuit with higher pixel density.

In FIG. 7, a second conformal layer 702 is formed over the first inner layer structure 202*a* and over the second inner layer structure 202*b*. Due to its conformal nature, the second conformal layer 702 has at least three indentations 702*a*, 702*b*, 702*c* along each of its outer sidewalls and which correspond to indentations for the first and second inner layer structures 202*a*, 202*b*. In some embodiments, the second conformal layer 702 is an oxide, such as silicon dioxide for example, and can have the same composition as the first and second inner layer structures 202*a*, 202*b*.

In FIG. 8, a contact etch stop layer 802 is formed over the second conformal layer 702, and an insulator layer 804, such as a low-k dielectric layer, is formed over the contact etch stop layer 802. A chemical mechanical planarization (CMP)

operation can be carried out on an upper surface of the insulator layer 804 to provide a planarized or level upper surface.

In FIG. 9, a source/drain contact 904 is formed through the insulator layer 804, the contact etch stop layer 802, and the second conformal layer 702. Thus, first and second sidewall spacer structures having outer sidewalls that face opposite sidewalls of the source/drain contact 904 and are disposed along outer sidewalls of the first and second gate electrode structures 104*a*, 104*b*, respectively. The first and second outer sidewalls of the first and second sidewall spacer structures each have an outer sidewall with at least two indentations. In FIG. 9's example, if the source/drain contact 904 has a first width, w1 (relatively wide source/drain contact in FIG. 9), the first and second sidewall spacer structures each have two indentations 702*b*, 702*c*. However, if the source/drain contact has a second width, w2 (relatively narrow source/drain contact in FIG. 9), then the first and second sidewall spacer structures each have three indentations 702*a*, 702*b*, 702*c*.

The method of FIGS. 10-18 is similar to the method of FIG. 1-9 with corresponding reference numbers indicating as such. However, whereas FIG. 6 showed an example where the sacrificial spacer structure was fully removed, the embodiment of FIG. 15 shows an example where the sacrificial spacer structure has been only partially removed. Thus, the sacrificial spacer structure 1502*a*, 1502*b* in FIG. 15 has been reduced in size relative to FIG. 14 (in particular the sacrificial spacer structure has been thinned laterally and reduced in height), but still resides on a ledge of the base portion 602 of the first conformal layer. In some embodiments, each sacrificial spacer structure 1502*a*, 1502*b* in FIG. 15 has a lateral width that is less than 70% of the lateral width of the sidewall spacers 302*a*, 302*b* in FIG. 14, or is between 50% and 1% of the lateral width in FIG. 14, or is between 60% and 20% of the lateral width of FIG. 14. Thus, the sacrificial spacer structure 1502*a*, 1502*b* in FIG. 15 can be less than 70% of width of the ledge for the first conformal layer, can be between 50% and 1% of the width of the ledge for the first conformal layer in FIG. 14, or can be between 60% and 20% of the width of the ledge for the first conformal layer of FIG. 14. Further, when the second conformal layer 702 is formed in FIG. 16, the second conformal layer has at least four indentations 702*a*, 702*b*, 702*c*, 702*d* along each outer sidewall of the gate electrode structures.

FIG. 19 shows a flow chart in accordance with some embodiments. The description below of FIG. 19 refers to cross-sectional views of FIGS. 1-18 as examples. It will be appreciated, however that while FIGS. 1-18 and FIG. 19 are described as a series of acts, these illustrated and/or described acts are not limiting in that the order of the acts can be altered in other embodiments, and the methods disclosed are also applicable to other structures. In other embodiments, some acts that are illustrated and/or described may be omitted in whole or in part, and other acts that are not necessary shown are illustrated may also be inserted into the manufacturing flows of FIGS. 1-19.

In 1902, a gate electrode is formed over a semiconductor substrate. Thus, act 1902 can be consistent with some embodiments of FIG. 1 and/or FIG. 10.

In 1904, a first conformal layer is formed over an upper surface of the gate electrode and along sidewalls of the gate electrode. In 1906, a sacrificial conformal layer is formed over an upper surface of the first conformal layer and along sidewalls of the first conformal layer. Thus, acts 1904 and 1906 can be consistent with some embodiments of FIG. 2 and/or FIG. 11.

In 1908, a first etch is performed that vertically etches back the sacrificial conformal layer to remove lateral portions of the sacrificial conformal layer, thereby leaving sacrificial spacers along outer sidewalls of the first conformal layer. Thus, act 1908 can be consistent with some embodiments of FIG. 3 and/or FIG. 12.

In 1910, a second etch is performed that laterally etches back the first conformal layer to leave indentations in the outer sidewalls of the first conformal layer where uppermost tips of the sacrificial spacers meet the first conformal layer. Thus, act 1910 can be consistent with some embodiments of FIG. 4 and/or FIG. 13.

In 1912, an ion implantation is carried out with the first conformal layer along the outer sidewall of the first gate electrode and the sacrificial spacers in place on ledges of the first conformal layer. Thus, act 1912 can be consistent with some embodiments of FIG. 5 and/or FIG. 14.

In 1914, after the ion implantation, a third etch is carried out that at least partially removes the sacrificial spacers. In some cases, such as in FIG. 6, etching back the second conformal layer and the first conformal layer fully removes the second conformal layer such that the ledge of the first conformal layer is fully cleared. In other cases, such as in FIG. 15, etching back the second conformal layer and the first conformal layer only partially removes the second conformal layer such that a portion of the sacrificial spacers is left on the ledges of the first conformal layer. Thus, act 1914 can be consistent with some embodiments of FIG. 6 and/or FIG. 15.

In 1916, a second conformal layer is formed on the first conformal layer. In some cases, the second conformal layer can have the same material composition as the first conformal layer—such as an oxide (e.g., silicon dioxide)—though the first and second conformal layers can also have different compositions in other embodiments. Thus, act 1916 can be consistent with some embodiments of FIG. 7 and/or FIG. 16.

In 1918, a contact etch stop layer (CESL), which can also be a conformal layer, is formed over the second conformal layer. An insulator layer is then formed over the CESL, and a chemical mechanical planarization (CMP) operation can be carried out on an upper surface of the insulator layer. Thus, act 1918 can be consistent with some embodiments of FIG. 8 and/or FIG. 17.

In 1920, a contact opening is formed through the insulator layer, the CESL, and the second conformal layer; and a source/drain contact that ohmically couples to the source/drain region is formed in the contact opening. Thus, act 1920 can be consistent with some embodiments of FIG. 9 and/or FIG. 18.

Figure 20A:
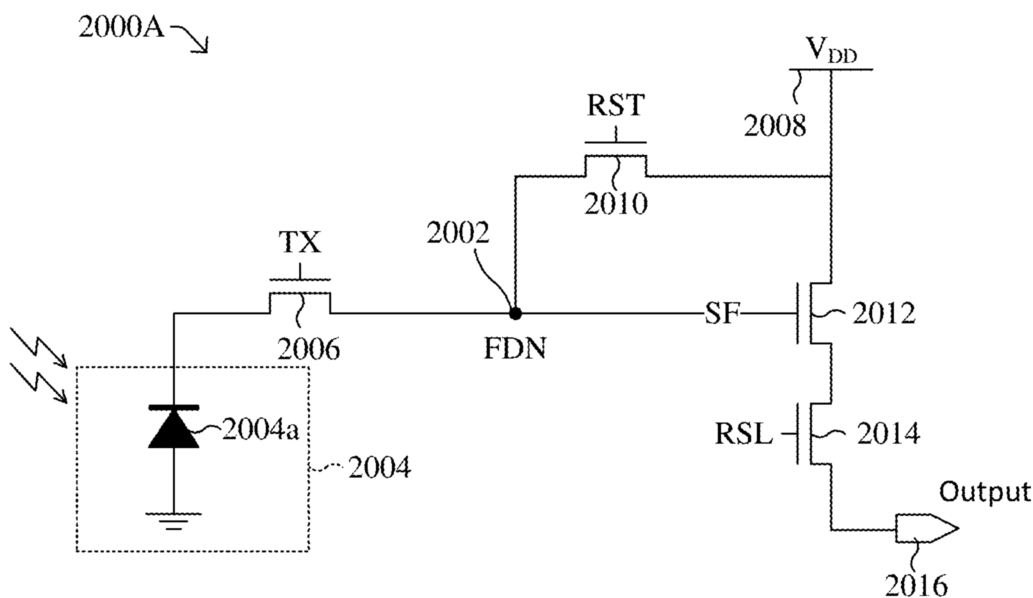
FIGS. 20A-20B each illustrate a circuit schematic for a single pixel included in a CMOS image sensor in accordance with some embodiments.

In some cases, image sensor devices include a number of photodetectors with corresponding circuitry such that the image sensor device can capture an image with a large number of pixels. With reference to FIG. 20A, a circuit diagram 2000A of some embodiments of an image sensor corresponding to a single pixel in accordance with some embodiments is provided. As illustrated, a floating diffusion node (FDN) 2002 is selectively coupled to a photodetector 2004 by a transfer transistor 2006. FDN 2002 is also selectively coupled to a power source 2008 by a reset transistor 2010. The photodetector 2004 may be, for example, a single photodiode 2004*a*, and/or the power source 2008 may be, for example, a direct current (DC) power source such as a VDD line. The transfer transistor 2006 is configured to selectively transfer charge accumulated in the photodetector 2004 to the FDN 2002, and the reset transistor 2010 is configured to set (e.g., clear or pre-charge) charge stored at the FDN 2002. The FDN 2002 gates a source follower transistor 2012 that selectively couples the power source 2008 to a row select transistor 2014, and the row select transistor 2014 selectively couples the source follower transistor 2012 to an output 2016. The source follower transistor 2012 is configured to non-destructively read and amplify charge stored at the FDN 2002, and the row select transistor 2014 is configured to select the pixel sensor for readout.

Figure 20B:
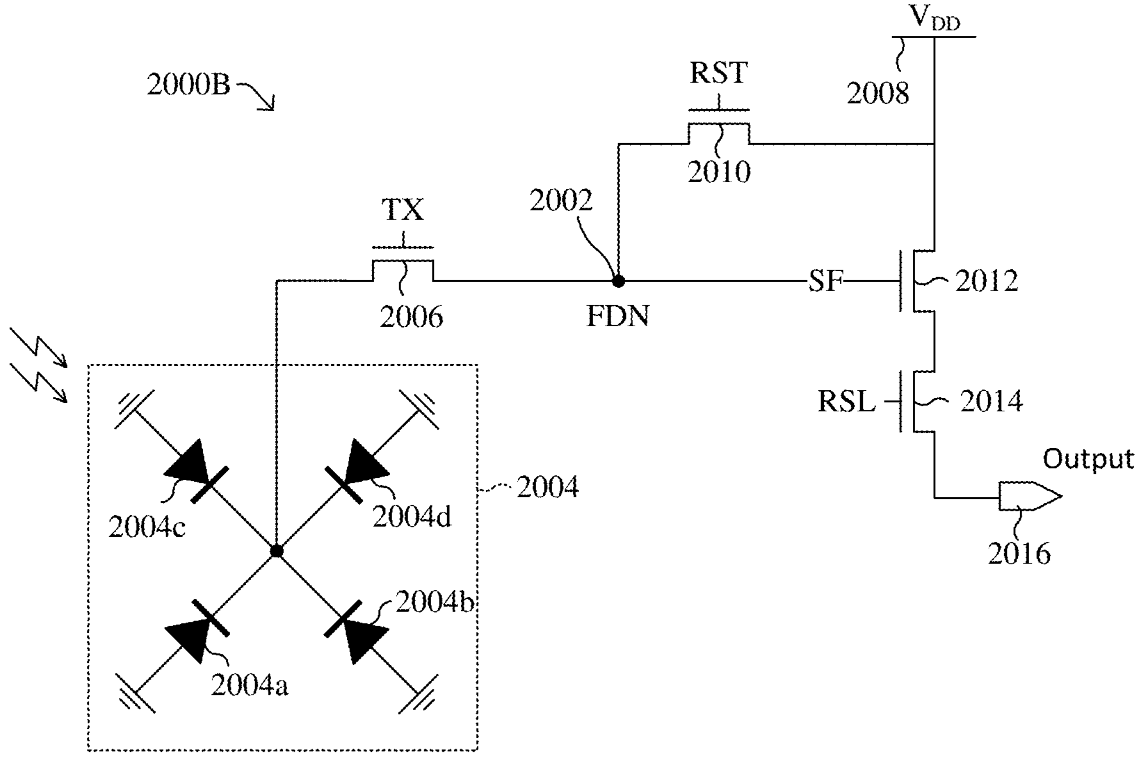

FIG. 20B illustrates another circuit diagram 2000B that is similar to that of FIG. 20A, except the photodetector 2004 in FIG. 20B includes four photodiodes 2004*a*-2004*d* rather than a single photodiode 2004*a* as illustrated in FIG. 20A. FIG. 20B's circuit provides greater light gathering capability, while FIG. 20A's circuit provides a more compact layout, but both can be desirable depending on the implementation. Other number of photodiodes or other photodetectors can also be included in a pixel sensor, and pixel sensors can also include more or less transistors than the illustrated four transistors. For example, other embodiments of the image sensor may include two, three, five, or six transistors.

Figure 21:
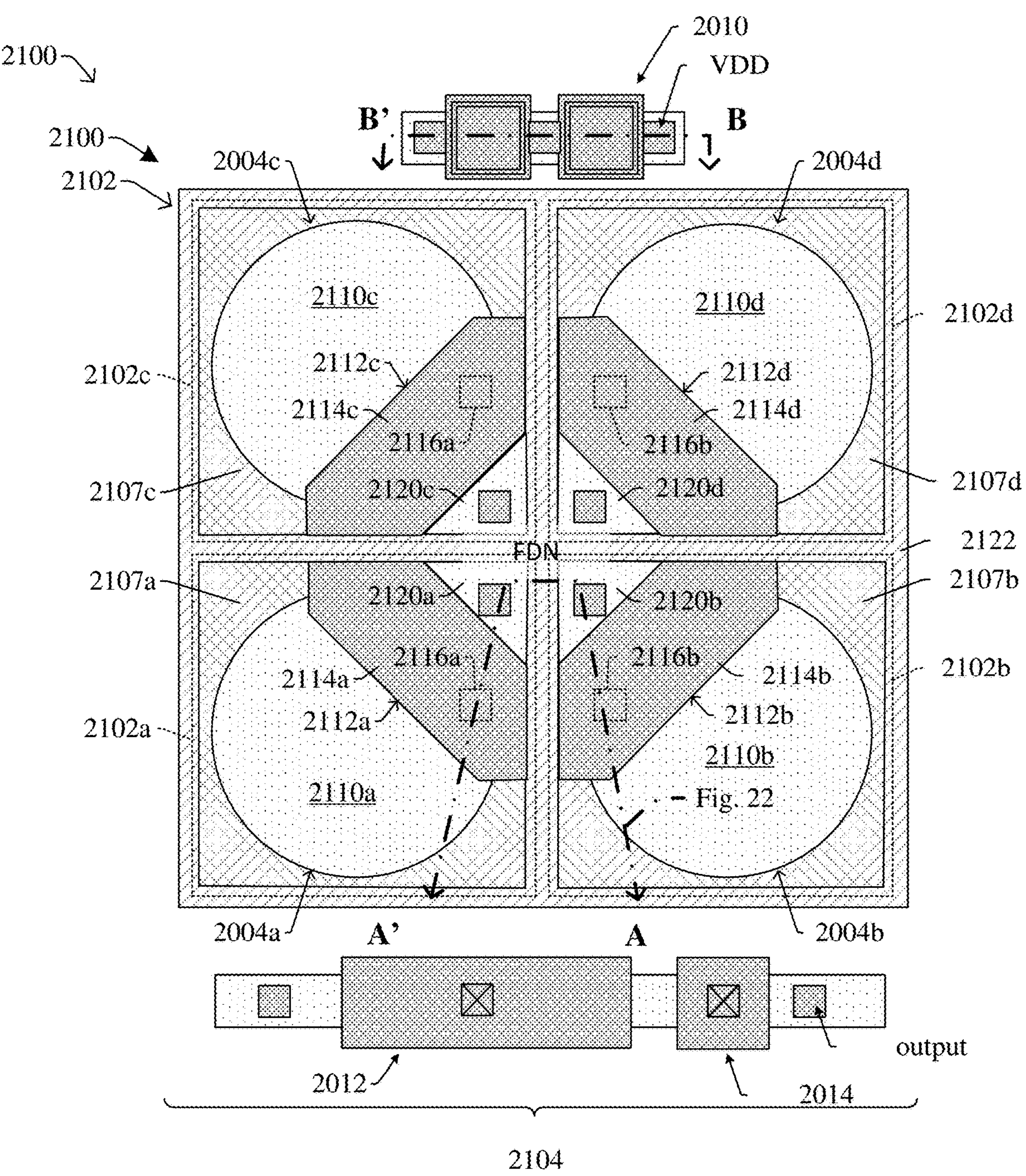
FIG. 21 illustrates a top view of a pixel of a CMOS image sensor in accordance with some embodiments.
Figure 22:
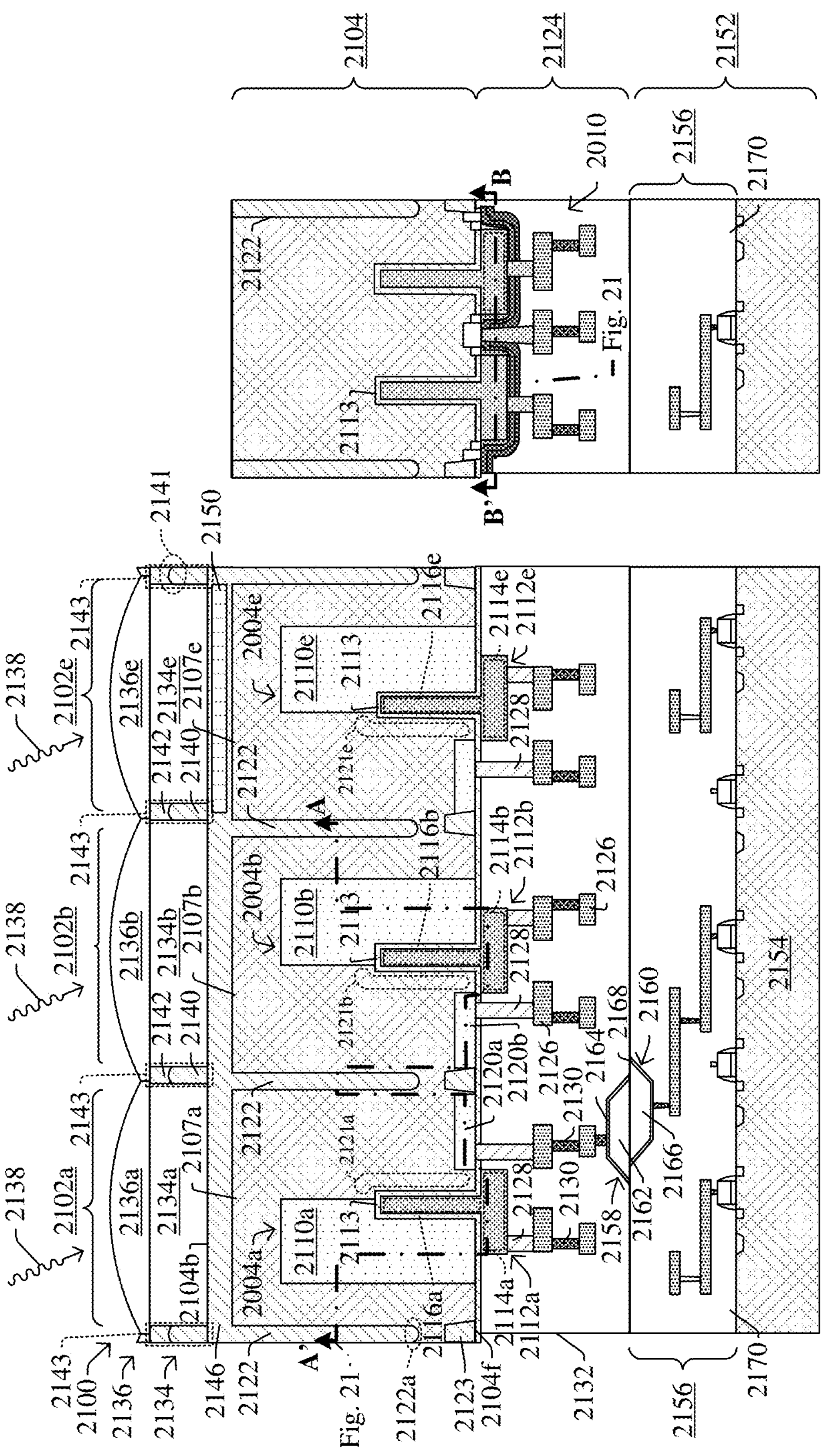
FIG. 22 illustrates a cross-sectional view of a CMOS image sensor in accordance with some embodiments.

FIG. 21 and FIG. 22, which are now referred to concurrently, depict some embodiments of an image sensor 2100 which can be consistent with the schematic illustration of FIG. 20B. More particularly, FIG. 21 illustrates a top view of the image sensor 2100, and FIG. 22 illustrates a cross-sectional view of the image sensor 2100, as indicated by section lines A-A'. It will be appreciated that FIG. 21 and FIG. 22 are simplified drawings, and other un-illustrated features are often present in actual implementations. Further, though FIG. 21 shows four photodetectors radially disposed around a central point that generally corresponds to FDN 2002, in other embodiments, other arrangements could be used—for example three photodetectors, five photodetectors, etc., could be arranged around a central point; or the photodetectors could lack a central point in other embodiments.

The image sensor 2100 includes a plurality of pixel devices arranged in or on a semiconductor substrate 2104, which may also be referred to as an image sensor substrate in some embodiments. In the illustrated example, the pixel devices 2102 include a first pixel device 2102*a*, second pixel device 2102*b*, third pixel device 2102*c*, and fourth pixel device 2102*d* arranged in grid-like fashion, though in general any number of pixel devices may be present. Because the pixel devices 2102 generally have the same features as one another, rather than separately calling out each feature of each individual pixel device, the description below will refer to the first pixel device 2102*a* with it being understood that the each described feature of the first pixel device 2102*a* is applicable to each of the other individual pixel devices. Further, it will be appreciated that while each of the pixel devices 2102 generally have the same features as one another, one or more of the pixel devices (e.g., first pixel device 2102*a*) may have a layout that may be rotated and/or altered slightly relative to that of another pixel device (e.g., second pixel device 2102*b*, third pixel device 2102*c*, and fourth pixel device 2102*d*) for example in order to "tile" the pixel devices 2102 together in the grid.

The first pixel device 2102*a* includes a first photodetector 2004*a*. The first photodetector 2004*a* is defined by a photojunction where first bulk region 2107*a* of the semiconductor substrate 2104 meets a first collector region 2110*a*. The first bulk region 2107*a* and the first collector region 2110*a* have opposite doping types, such that the first photodetector 2004*a* may, for example, correspond to a PN junction or other suitable photojunction. For example, the first bulk region 2107*a* may be p-type and the first collector region 2110*a* may be n-type. The second photodetector 2004*b*, third photodetector 2004*c*, and fourth photodetector 2004*d* include second bulk region 2107*b*, third bulk region 2107*c*, and fourth bulk region 2107*d*, respectively; and second collector region 2110*b*, third collector region 2110*c*, and fourth collector region 2110*d*, respectively.

The first pixel device 2102*a* further includes a first transfer transistor 2112*a* disposed over the first photodetector 2004*a*. The first transfer transistor 2112*a* comprises a transfer gate electrode that includes a first lateral portion 2114*a* extending over the frontside 2104*f* of the semiconductor substrate 2104 and a first vertical portion 2116*a* extending to a first depth, d1, below the frontside 2104*f* of the semiconductor substrate 2104. The first vertical portion 2116*a* protrudes into the first collector region 2110*a*, but is separated from the first collector region 2110*a* by a transfer gate dielectric layer 2113. The transfer gate dielectric layer 2113 may be or comprise, for example, silicon dioxide, a high-k dielectric, and/or some other suitable dielectric(s). A first floating node 2120*a* has the same doping type as the first collector region 2110*a* and an opposite doping type as the first bulk region 2107*a*, such that a first channel region 2121*a* extends in the first bulk region 2107*a* alongside the first vertical portion 2116*a* of the first transfer gate electrode. The first transfer gate electrode may be or comprise, for example, doped polysilicon and/or some other suitable conductive material(s), such as a metal comprising copper, tungsten, aluminum or others. The illustrated embodiment also illustrates a second transfer transistor 2112*b*, a third transfer transistor 2112*c*, and a fourth transfer transistor 2112*d*, respectively; having second lateral and vertical portions 2114*b*, 2116*b*; third lateral and vertical portions 2114*c*, 2116*c*; and fourth lateral and vertical portions 2114*d*, 2116*d*; respectively.

A backside deep trench isolation structure 2122 includes pillars or rings extending from a backside 2104*b* of the semiconductor substrate 2104 to a second depth, $d_2$, below a frontside 2104*f* of the semiconductor substrate 2104. The backside deep trench isolation structure 2122 laterally surrounds the individual bulk regions of the individual photodetectors to electrically and optically isolate the photodetectors from one another. Thus, the backside deep trench isolation structure 2122 extends from the backside 2104*b* of the semiconductor substrate 2104 partially towards the frontside 2104*f* of the semiconductor substrate 2104, but does not pass through the entire thickness $t_s$ of semiconductor substrate 2104. The backside deep trench isolation structure 2122 may, for example, be or comprise silicon dioxide and/or some other suitable dielectric(s). As can be seen in FIG. 22, each pillar or ring of the backside deep trench isolation structure 2122 includes a curved distal end 2122*a*.

A frontside shallow trench isolation structure 2123 includes pillars or rings extending from the frontside 2104*f* of the semiconductor substrate 2104. The frontside shallow trench isolation structure 2123 laterally surrounds the individual bulk regions of the individual photodetectors to electrically and optically isolate the photodetectors from one another. Thus, the frontside shallow trench isolation structure 2123 extends from the frontside 2104*f* of the semiconductor substrate 2104 partially towards the backside 2104*b* of the semiconductor substrate 2104, but does not pass through the entire thickness $t_s$ of semiconductor substrate 2104. The frontside shallow trench isolation structure 2123 is generally shorter in height than the backside deep trench isolation structure. The frontside shallow trench isolation structure 2123 may, for example, be or comprise silicon dioxide and/or some other suitable dielectric(s).

An image device interconnect structure 2124 is disposed over the frontside 2104*f* of the semiconductor substrate 2104. The image device interconnect structure 2124 includes a plurality of wires 2126, a plurality of contacts 2128, and a plurality of vias 2130 stacked over transfer transistors. The wires 2126 and/or the vias 2130 may be or comprise the same material, aluminum copper, aluminum, copper, some other suitable conductive material(s), or any combination of the foregoing. The contacts 2128 may be or comprise, for example, tungsten, copper, aluminum copper, some other suitable conductive material(s), or any combination of the foregoing. A frontside dielectric layer 2132 surrounds the wires 2126, the contacts 2128, the vias 2130, and other structures on the frontside of the semiconductor substrate 2104. The frontside dielectric layer 2132 may be or comprise, for example, silicon dioxide, a low k dielectric, silicon carbide, silicon nitride, some other suitable dielectric (s), or any combination of the foregoing.

A grid structure 2143 overlies the backside 2104*b* of the semiconductor substrate 2104. The grid structure 2143 may be comprised of metal, dielectric, and/or a combination of metal and dielectric. In the illustrated example, the grid structure includes a metal grid structure 2140 and a dielectric grid structure 2142 overlies the metal grid structure 2140. In other embodiments, the metal grid structure 2140 and dielectric grid structure can be "flipped" vertically relative to one another, and/or can be spaced apart vertically from one another rather than directly contacting one another as illustrated. In various embodiments, the grid structure 2143 comprises sidewalls defining a plurality of openings that directly overlie a corresponding photodetector in the plurality of photodetectors. The grid structure 2143 comprises one or more metal layers and/or one or more dielectric layers that is/are configured to reduce cross talk between adjacent photodetectors. Further, the grid structure 2143 may be configured to direct the incident light to a corresponding underlying photodetector by total internal reflection (TIR), thereby further reducing cross talk and increasing a quantum efficiency (QE) of the photodetectors. The grid structure 2143 can have a height that is less than a height of the deep trench isolation structure, and the grid structure 2143 can have a rounded distal end 2141 in some embodiments. In the illustrated example, the metal grid structure 2140 may be or comprise, for example, tungsten, copper, aluminum, gold, silver, or some other suitable metal(s), or any combination of the foregoing; and/or the dielectric grid structure 2142 can comprise silicon dioxide, silicon nitride, or a high-k dielectric, among other materials, in some embodiments.

In yet further embodiments, color filters 2134 are disposed within the openings of the grid structure 2143. The color filters 2134 are configured to transmit specific wavelengths of incident light while blocking other wavelengths of incident light. Further, a plurality of micro-lenses 2136 overlies the color filters 2134 and is configured to focus the incident light towards the photodetectors. In some embodiments, the photodetectors 2004 are configured to detect different wavelengths of incident light, such as red light, green light, and blue light, for example. To facilitate this detection, the various color filters 2134 filter different wavelengths of light, for example, according to a Bayer-filter pattern, such that the photodetectors 2004 detect different wavelengths of light. Thus, for example during operation, incident light 2138 strikes the first micro-lens 2136*a*, is directed through the first color filter 2134*a* where the incident light 2138 is filtered, and then the filtered light proceeds towards the first photodetector 2004*a*. The filtered light then interacts with the first photodetector 2004*a* to be transformed into an electrical signal, which is processed by circuitry of the photodetectors (including first transfer transistor 2112*a* and image device interconnect structure 2124). Similarly, the second micro-lens 2136*b* directs light though the second color filter 2134*b* and towards the second photodetector 2004*b*. Thus, the photodetectors 2004 can collectively generate digital image data through these electrical signals.

As can be seen in FIG. 22, a buffer layer 2146 can be arranged between the photodetectors 2004 and the color filters 2134. In some embodiments, the buffer layer 2146 is a dielectric, such as silicon dioxide or a low-k dielectric material. In the illustrated embodiment, a light shield structure 2150 is disposed within the buffer layer 2146, above the backside 2104*b* of the semiconductor substrate 2104, and extends laterally between neighboring grid segments of the grid structure 2143. In other embodiments, however, the light shield structure 2150 can be arranged on the same plane as the grid. Thus, for example in some embodiments, the light shield structure 2150 can have upper and lower surfaces that are approximately level or co-planar with upper and lower surfaces, respectively, of the grid structure 2143. In other embodiments, the light shield structure 2150 can have upper and lower surfaces that are approximately level or co-planar with upper and lower surfaces, respectively, of the metal grid structure 2142 and/or can have upper and lower surfaces that are approximately level or co-planar with upper and lower surfaces, respectively, of the dielectric grid structure 2142. The light shield structure 2150 directly overlies a fifth photodetector 2004*e* in the plurality of photodetectors. In some embodiments, the light shield structure 2150 has a first end that terminates under a first grid segment, and has a second end that terminates under a second grid segment. In further embodiments, the light shield structure 2150 comprises, for example, a metal material (e.g., copper, aluminum, titanium, tantalum, another metal material, or any combination of the foregoing), a metal oxide (e.g., aluminum oxide (e.g., $Al_2O_3$), titanium oxide ($TiO_2$), tantalum oxide ($Ta_2O_5$), another metal oxide, or any combination of the foregoing), a dielectric material (e.g., silicon dioxide, or another dielectric material), a nitride (e.g., titanium nitride, tantalum nitride, or another nitride), a polymer, an organic material, an inorganic material, another suitable material, or any combination of the foregoing. By virtue of a material, location, and/or shape of the light shield structure 2150, the light shield structure 2150 is configured to block/impede at least a portion of incident light from reaching the fifth photodetector 2004*e*. Further, the light shield structure 2150 is laterally offset from at least a portion of the first and second photodetectors 2004*a*, 2004*b*, such that incident light 2138 disposed directly over the first and second photodetectors 2004*a*, 2004*b* is not blocked by the light shield structure 2150. As viewed from above, the light shield structure 2150, extends entirely along at least one side of the pixel region.

A logic device 2152 can be stacked over the image device interconnect structure 2124, and can include a logic semiconductor substrate 2154 and a logic interconnect structure 2156. The logic semiconductor substrate 2154 can include a monocrystalline substrate, and/or a semiconductor on insulator (SOI) substrate, among others, and includes a number of semiconductor devices, such as bipolar junction transistors (BJTs), metal oxide semiconductor field effect transistors (MOSFETs), which can manifest as lateral transistors, vertical transistors, or FinFETs, among others. The logic interconnect structure 2156 is electrically coupled to the image device interconnect structure 2124 through an image device bond pad 2158 and a logic device bond pad 2160. The image device bond pad 2158 has a trapezoidal cross-sectional shape and includes a copper body 2162 with a barrier layer 2164 separating the copper body from the frontside dielectric layer 2132. Similarly, the logic device bond pad 2160 has an inverted trapezoidal cross-sectional shape and includes a copper body 2166 with a barrier layer 2168 separating the copper body from a logic interconnect dielectric structure 2170. At bonding interface where the image device bond pad 2158 meets the logic device bond pad 2160, the image device bond pad 2158 can have a partial interface with dielectric material of the logic interconnect dielectric structure 2170; and similarly the logic device bond pad 2160 can have a partial interface with dielectric material of the frontside dielectric layer 2132.

As shown in right-hand side of FIG. 22, the reset transistor 2010 can have a contact that extends between neighboring gate electrodes, whereby sidewall spacers of the gate electrode are consistent with those described in other examples herein (e.g., in FIGS. 24-31 or other embodiments illustrated and/or described herein).

Figure 23:
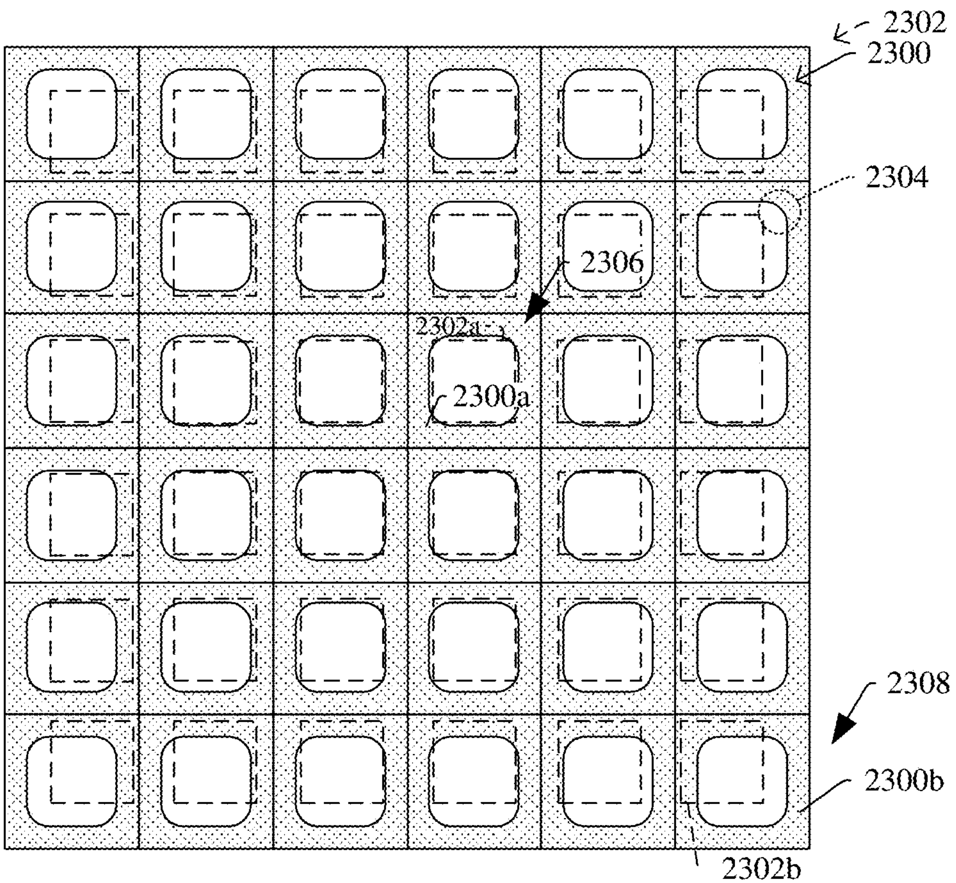
FIG. 23 illustrates a simplified top view of a CMOS image sensor that includes an array of pixels in accordance with some embodiments.

Referring to FIG. 23, one can see a top view of a larger number of pixels (e.g., a grid of pixels that includes six columns and six rows of pixels, each of which corresponds for example to the image sensor 2100 of FIG. 21). In FIG. 23, each pixel is illustrated as being laterally surrounded by a backside deep trench isolation (DTI) grid structure 2300 (corresponding to backside deep trench isolation structure 2122 of FIG. 21), as well as a grid structure represented by dashed line 2302 (e.g., corresponding to grid structure 2143 of FIG. 21). Thus, one can see that at a larger scale, the DTI grid structure 2300 and the grid structure 2302 each have a grid shape made up of a series of ring-shaped structures that are merged with one another when viewed from above. Each ring-shaped structure laterally surrounds the bulk region of a corresponding photodetector, and the ring-shaped structures merge with one another to give the backside trench isolation structure a grid-like geometry. The inner portion of each ring-shaped structure has a curved corner 2304 in some embodiments, and thus, can have a circular central opening, a square central opening with rounded corners, an oval shaped central opening, or a rectangular central opening with rounded corners as viewed from above. Moreover, in a central region of the pixel array (e.g., 2306), the DTI grid structure 2300 has ring-shaped structures that are substantially aligned with ring-shaped structures of the grid structure 2302 in an x direction and a y-direction. For example, a first ring-shaped segment of deep trench isolation structure 2300*a* and corresponding ring-shaped segment of grid structure 2302*a* are aligned in a central region 2306 of the pixel array. However, as you move away from the central region 2306 towards an edge region of the array in the y direction, segments of the grid structure 2302 are more and more offset in the y-direction from the segments of the DTI grid structure 2300 (and are offset more towards the center region as you move further from the center region in the y-direction). Similarly, as you move away from the central region towards an edge region of the array in the x direction, segments of the grid structure 2302 are more and more offset in the x-direction from the segments of the DTI grid structure 2300 (and are offset more towards the center region as you move further from the center region in the x-direction). For example, in the lower right edge region 2308, a ring-shaped segment of deep trench isolation structure 2300*b* and corresponding ring-shaped segment of grid structure 2302*b* are offset in the x-direction and y-direction in an edge region 2308 of the array. In instances where impingent light originates at a single point directly over the central region of the array, this increasing lateral offset in the x-direction and y-direction can help the grid structure (the dashed line 2302*b*) to reflect the light by a greater amount as the light gets closer to the edge region 2308, which can provide better performance in some regards.

Figure 24:
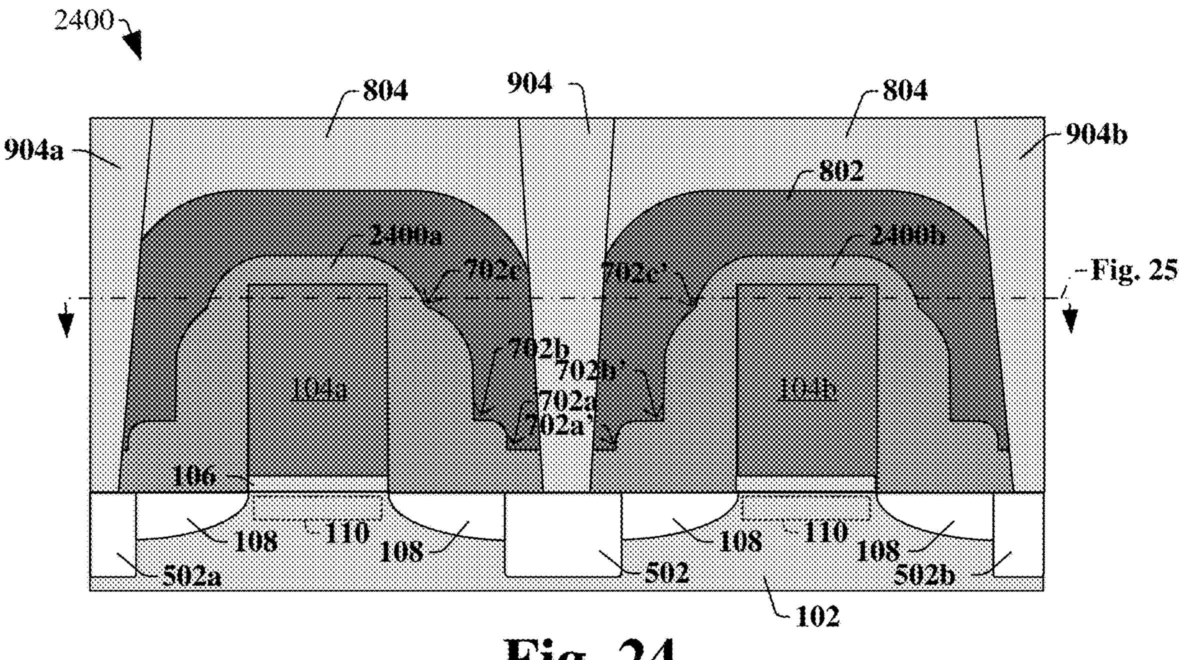
FIG. 24 illustrates a cross-sectional view of an integrated circuit with a source/drain contact that extends downwardly between sidewall spacer structures of neighboring gate electrode structures in accordance with some embodiments.
Figure 25:
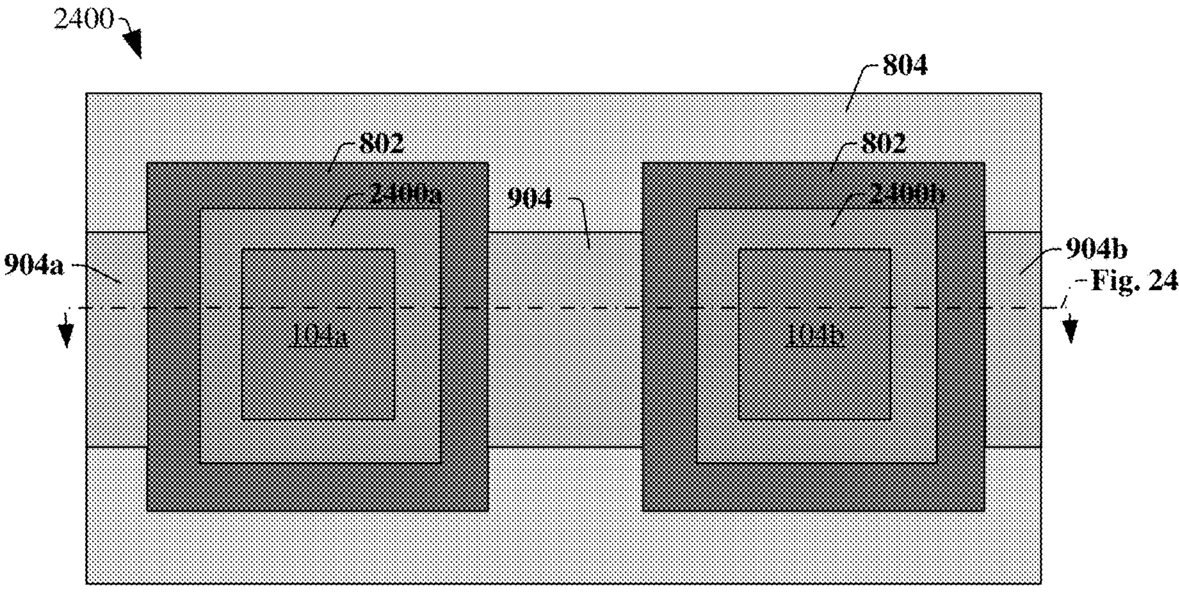
FIG. 25 illustrates a top view consistent with some embodiments of FIG. 24's integrated circuit.

FIG. 24 shows a cross-sectional side view of an integrated circuit 2400 in accordance with some embodiments, and FIG. 25 shows a corresponding top view. As shown in FIGS. 24-25, the integrated circuit 2400 includes a semiconductor substrate 102, and first and second gate electrode structures 104*a*, 104*b* disposed over the semiconductor substrate 102 and spaced apart laterally from one another. The first and second gate electrode structures 104*a*, 104*b* are separated from a channel region 110 of the substrate by a gate dielectric structure 106, such as a high-k dielectric. A common source/drain region 502 is disposed in the semiconductor substrate 102 between the first and second gate electrode structures 104*a*, 104*b*, and an insulator layer 804 overlies a contact etch stop layer 802 and the first and second gate electrode structures 104*a*, 104*b*. First and second sidewall spacer structures 2400*a*, 2400*b* are disposed along outer sidewalls of the first and second gate electrode structures 104*a*, 104*b*, respectively, and have first and second outer sidewalls, respectively, adjacent to a common source/drain contact 904. The first and second sidewall spacer structures 2400*a*, 2400*b* laterally surround the first and second gate electrode structures 104*a*, 104*b*, respectively. The common source/drain contact 904 extends through the insulator layer 804 between the first and second gate electrode structures to contact the common source/drain region 502. First and second other source/drain contacts 904*a*, 904*b* are coupled to other source/drain regions 502*a*, 502*b*, respectively.

The first sidewall spacer structure 2400*a* has a first outer sidewall nearest the common source/drain contact 904 which includes at least two indentations facing a first side of the common source/drain contact 904. The second sidewall spacer structure 2400*b* has a second outer sidewall nearest the common source/drain contact 904 which includes at least two indentations facing a second side of the common source/drain contact 904. In some embodiments, the first and second outer sidewalls each include at least three indentations (e.g., 702*a*-702*c* and 702*a*'-702*c*') or at least four indentations along the outer sidewalls facing the source/drain contact. Further, in the illustrated example, the first and second sidewall spacer structures 2400*a*, 2400*b* are symmetrical in that they have two indentations on both outer sidewalls.

In some embodiments, the first and second gate electrode structures 104*a*, 104*b* can correspond to a source follower transistor (e.g., 2012 of FIG. 20) and a row select transistor (e.g., 2014 of FIG. 20) of a CMOS image sensor circuit; and/or can correspond to adjacent gate electrode structures of one or more transfer transistors (e.g., 2006 of FIG. 20) and/or a reset transistor (e.g., 2010 of FIG. 20); though in general the gate electrode structures can be any transistors in any type of circuit and are not limited to pixel sensor circuits.

FIGS. 26-29 show additional examples of integrated circuits in accordance with some embodiments. In FIGS. 26-29, the first sidewall spacer includes a first inner layer structure 202*a* extending along the outer sidewall of the first gate electrode structure 104*a* and extending laterally over an upper surface of the first gate electrode structure 104*a*; and the second sidewall spacer includes a second inner layer structure 202*b* extending along the outer sidewall of the second gate electrode structure 104*b* and extending laterally over an upper surface of the second gate electrode structure 104*b*. The first and second inner layer structures include a base portion 602 and a collar portion 604 extending upward from the base portion. The base portion and the collar portion laterally surround the gate electrode. The base portion 602 is wider than the collar portion 604 such that an upper surface of the base portion corresponds to a ledge.

A first sidewall spacer structure, which may also be referred to as a conformal layer 702 in some contexts, extends over an upper surface of the base portion 602 and collar portion 604 for each sidewall spacer. A first indentation 702*a* corresponds to a first inner corner of the first sidewall spacer structure where a lateral surface of the first sidewall spacer structure meets a sidewall of the first sidewall spacer structure. A second indentation 702*b* or 702*c* corresponds to a second inner corner of the first sidewall spacer structure.

In FIGS. 26-27, the first sidewall spacer structure 702 fully covers the ledge, such that the first sidewall spacer structure entirely covers an upper surface of the first inner layer structure. The first outer sidewall of the first sidewall spacer structure includes three indentations along the first outer sidewall facing the first side of the common source/drain contact 904, and the second outer sidewall includes three indentations along the second outer sidewall facing the second side of the common source/drain contact 904.

In FIGS. 28-29, a nitride sidewall spacer structure 1502*a*, 1502*b* is disposed on the ledge of the base portion 602 of the first inner layer structure, and thus is disposed between some portions of the first inner layer structure 202*a* and the first sidewall spacer structure 702. In FIG. 28, the first outer sidewall includes four indentations 702*a*-702*d* along the first outer sidewall and facing the first side of the common source/drain contact 904, and the second outer sidewall includes four indentations along the second outer sidewall and facing the second side of the common source/drain contact 904. In FIG. 29, the first outer sidewall includes three indentations 702*b*-702*d* along the first outer sidewall and facing the first side of the common source/drain contact 904, and the second outer sidewall also includes three indentations along the second outer sidewall and facing the second side of the common source/drain contact 904.

Figure 30:
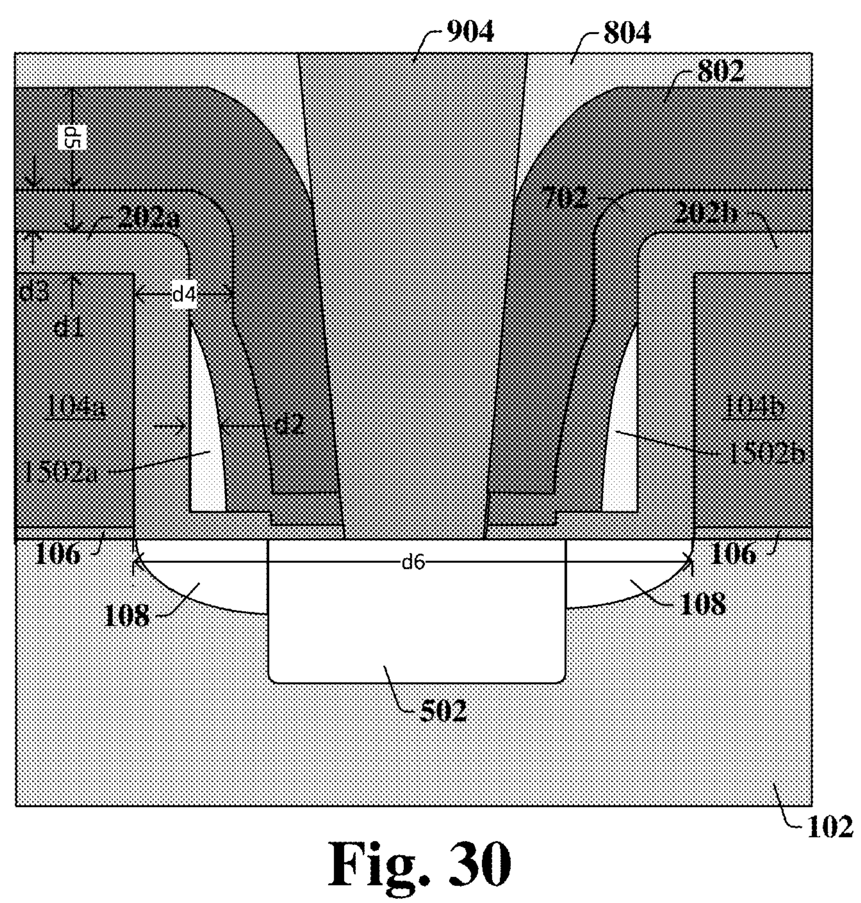
Figure 31:
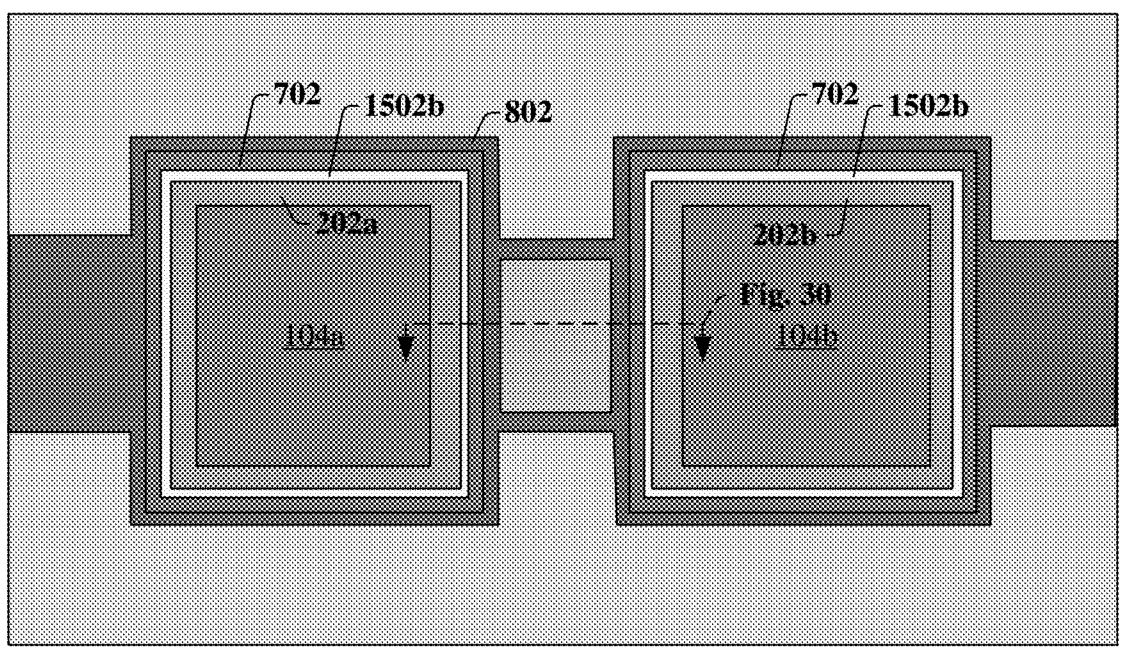
FIG. 31 illustrates a top view consistent with some embodiments of FIG. 30's integrated circuit.

FIG. 30 illustrates a cross-sectional view of another embodiment of an integrated circuit with reduced thickness sidewall spacers, and FIG. 31 illustrates a top view according to some embodiments consistent with FIG. 30. In this example, the first inner spacer structure can have a first thickness d1 of approximately 8 nm to 15 nm, being about 12 nm in some embodiments. The spacer structure can have a second thickness d2 at half maximum height of approximately 5 nm to 10 nm, being about 7 nm in some embodiments. The conformal layer can have a third thickness d3 of approximately 5 nm to 20 nm, being about 10 nm in some embodiments. Thus, a fourth thickness d4 of the sidewall spacer, including the first inner spacer structure and the conformal layer, can be about 15 nm to about 30 nm, being about 23 nm in some embodiments. The contact etch stop layer can have a fifth thickness d5 of approximately ranging from 20 nm to 40 nm, being about 30 nm in some embodiments. Inner edges of the first and second gate electrode structures 104*a*, 104*b* are spaced apart by a sixth distance d6 ranging from approximately 120 nm to approximately 170 nm, being about 146 nm in some embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:

a semiconductor substrate;

first and second gate electrode structures disposed over the semiconductor substrate and spaced apart laterally from one another;

a common source/drain region disposed in the semiconductor substrate between the first and second gate electrode structures;

an insulator layer overlying the first and second gate electrode structures;

a source/drain contact extending through the insulator layer between the first and second gate electrode structures to contact the common source/drain region; and first and second sidewall spacer structures disposed along outer sidewalls of the first and second gate electrode structures, respectively, and having a material defining first and second outer sidewalls, respectively, adjacent to the source/drain contact; and wherein the material defining the first outer sidewall includes at least three indentations along the first outer sidewall facing a first side of the source/drain contact and wherein the material defining the second outer sidewall includes at least three indentations along the second outer sidewall facing a second side of the source/drain contact.

2. The integrated circuit of claim 1, wherein the first sidewall spacer structure comprises:

a first conformal layer along the first outer sidewall of the first gate electrode structure and extending laterally over an upper surface of the first gate electrode structure; and a second conformal layer that corresponds to the material, the second conformal layer extending over an upper surface of the first conformal layer and extending laterally over the upper surface of the first conformal layer over the first gate electrode structure, the material of the second conformal layer differing from a material of the first conformal layer.

3. The integrated circuit of claim 2, wherein a first indentation of the at least three indentations on the first outer sidewall corresponds to a first inner corner of the second conformal layer where a lateral surface of the second conformal layer meets a sidewall of the second conformal layer.

4. The integrated circuit of claim 3, wherein a second indentation of the at least three indentations on the first outer sidewall corresponds to a second inner corner of the second conformal layer, the second inner corner being disposed above the first inner corner.

5. The integrated circuit of claim 2, wherein the first conformal layer comprises a base portion and a collar portion extending upward from the base portion, the base portion and the collar portion each laterally surrounding the first gate electrode structure, wherein the base portion is wider than the collar portion such that an upper surface of the base portion corresponds to a ledge.

6. The integrated circuit of claim 5, wherein the collar portion has a thickness between its sidewalls and wherein nearest outer sidewalls of the first and second gate electrode structures are separated by a lateral spacing, wherein a ratio of the thickness to the lateral spacing ranges from 1:20 to 3:20.

7. The integrated circuit of claim 5, further comprising:

a nitride sidewall spacer disposed on the ledge and disposed between some portions of the first conformal layer and the second conformal layer.

8. The integrated circuit of claim 1, wherein the at least three indentations along the first outer sidewall have respective heights as measured from an upper surface of the semiconductor substrate that correspond to heights within the first and second gate electrode structures.

9. The integrated circuit of claim 8, wherein the first sidewall spacer structure comprises: a first conformal layer along the first outer sidewall of the first gate electrode structure; and a second conformal layer extending over an upper surface of the first conformal layer and extending laterally over an upper surface of the first gate electrode structure; and further comprising:

a contact etch stop layer disposed over the second conformal layer.

10. The integrated circuit of claim 1, wherein the first outer sidewall includes at least four indentations along the first outer sidewall and facing the first side of the source/drain contact, and wherein the second outer sidewall includes at least four indentations along the second outer sidewall and facing the second side of the source/drain contact.

11. The integrated circuit of claim 1, further comprising:

a photodetector disposed in the semiconductor substrate.

12. An integrated circuit, comprising:

a semiconductor substrate;

first and second gate electrode structures disposed over first and second channel regions in the semiconductor substrate, the first and second channel regions having a first conductivity type;

a doped region disposed in the semiconductor substrate between the first and second channel regions, the doped region having a second conductivity type opposite the first conductivity type;

a dielectric layer overlying the first and second gate electrode structures;

a contact extending through the dielectric layer between nearest neighboring sidewalls of the first and second gate electrode structures to contact the doped region; and first and second sidewall spacer structures disposed along outer sidewalls of the first and second gate electrode structures, respectively, and having a layer defining first and second outer sidewalls, respectively, adjacent to the contact; and wherein the layer defining the first outer sidewall includes at least three indentations along the first outer sidewall facing a first side of the contact.

13. The integrated circuit of claim 12, wherein the second outer sidewall includes at least two indentations along the second outer sidewall facing a second side of the contact.

14. The integrated circuit of claim 13, wherein the at least three indentations along the first outer sidewall are mirrored by at least three indentations along the second outer sidewall.

15. The integrated circuit of claim 14, wherein the first and second sidewall spacer structures comprise:

a first conformal layer comprising a base portion and a collar portion extending upward from the base portion, the base portion and the collar portion each laterally surrounding the first gate electrode structure, wherein the base portion is wider than the collar portion such that an upper surface of the base portion corresponds to a ledge; and a second conformal layer extending over an upper surface of the first conformal layer and extending laterally over the upper surface of the first conformal layer over the first gate electrode structure.

16. The integrated circuit of claim 15, wherein the collar portion has a thickness between its sidewalls and wherein nearest outer sidewalls of the first and second gate electrode structures are separated by a lateral spacing, wherein a ratio of the thickness to the lateral spacing ranges from 1:20 to 3:20.

17. An integrated circuit, comprising:

a substrate;

first and second channel regions disposed in the substrate, the first and second channel regions having a first conductivity type;

a common source/drain region disposed in the substrate between the first and second channel regions, the common source/drain region having a second conductivity type opposite the first conductivity type;

first and second gate electrode structures disposed over the first and second channel regions, respectively;

a dielectric layer overlying the first and second gate electrode structures;

a contact extending through the dielectric layer between nearest neighboring sidewalls of the first and second gate electrode structures to contact the common source/drain region; and first and second sidewall spacer structures disposed along outer sidewalls of the first and second gate electrode structures, respectively, and having a material defining first and second outer sidewalls of the first and second sidewall spacer structures facing the contact, wherein the material defining the first outer sidewall includes at least three indentations in the first outer sidewall.

18. The integrated circuit of claim 17, wherein the second outer sidewall includes at least two indentations along the second outer sidewall facing a second side of the contact.

19. The integrated circuit of claim 18, wherein a plane extends down a central axis of the contact, and wherein the at least two indentations along the first outer sidewall are mirrored by at least two indentations along the second outer sidewall about the central axis.

20. The integrated circuit of claim 19, wherein the first and second sidewall spacer structures include a first conformal layer comprising a base portion and a collar portion extending upward from the base portion, the base portion and the collar portion each laterally surrounding the first gate electrode structure, wherein the base portion is wider than the collar portion such that an upper surface of the base portion corresponds to a ledge.

* * * * *